United States Patent
Houston

(10) Patent No.: US 7,502,247 B2
(45) Date of Patent: Mar. 10, 2009

(54) MEMORY ARRAY WITH A DELAYED WORDLINE BOOST

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/828,465

(22) Filed: Jul. 26, 2007

(65) Prior Publication Data
US 2008/0019202 A1    Jan. 24, 2008

Related U.S. Application Data

(62) Division of application No. 11/191,349, filed on Jul. 28, 2005, now Pat. No. 7,289,354.

(51) Int. Cl.
*G11C 11/00* (2006.01)
(52) U.S. Cl. .................. 365/154; 365/189.09; 365/194; 365/226
(58) Field of Classification Search ............... 365/154, 365/189.09, 194, 226
See application file for complete search history.

(56) References Cited

U.S. PATENT DOCUMENTS

| 5,276,652 | A |   | 1/1994  | Anami |
|---|---|---|---|---|
| 5,724,292 | A | * | 3/1998  | Wada ........................ 365/207 |
| 6,405,277 | B1 |  | 6/2002  | Jen et al. |
| 6,639,826 | B2 |  | 10/2003 | Houston |
| 7,120,076 | B2 |  | 10/2006 | Sugahara |

* cited by examiner

*Primary Examiner*—Hoai V Ho
(74) *Attorney, Agent, or Firm*—Frederick J. Telecky, Jr.; Wade J. Brady, III

(57) ABSTRACT

Methods and a circuit for writing to an SRAM memory cell of an array are discussed that provide improved static noise margin, and minimal risk of data upsets during write operations. The write method first rapidly raises the wordline to a lower read voltage level for access, then after a time delay that allows the cells in the selected row to establish a stabilizing differential voltage on the associated bitlines, raises the wordline voltage to a boosted or higher write voltage level. An SRAM bitline enhancement circuit may also be utilized in association with the SRAM memory array and writing method, for enhancing the differential voltage produced by an SRAM memory cell of the array on associated first and second bitlines of the array of conventional SRAM cells (e.g., a conventional 6T differential cell). In one implementation, the SRAM bitline enhancement circuit comprises a half-latch or a sense amplifier connected to associated bitline pairs of the array for amplifying the differential voltage.

20 Claims, 9 Drawing Sheets

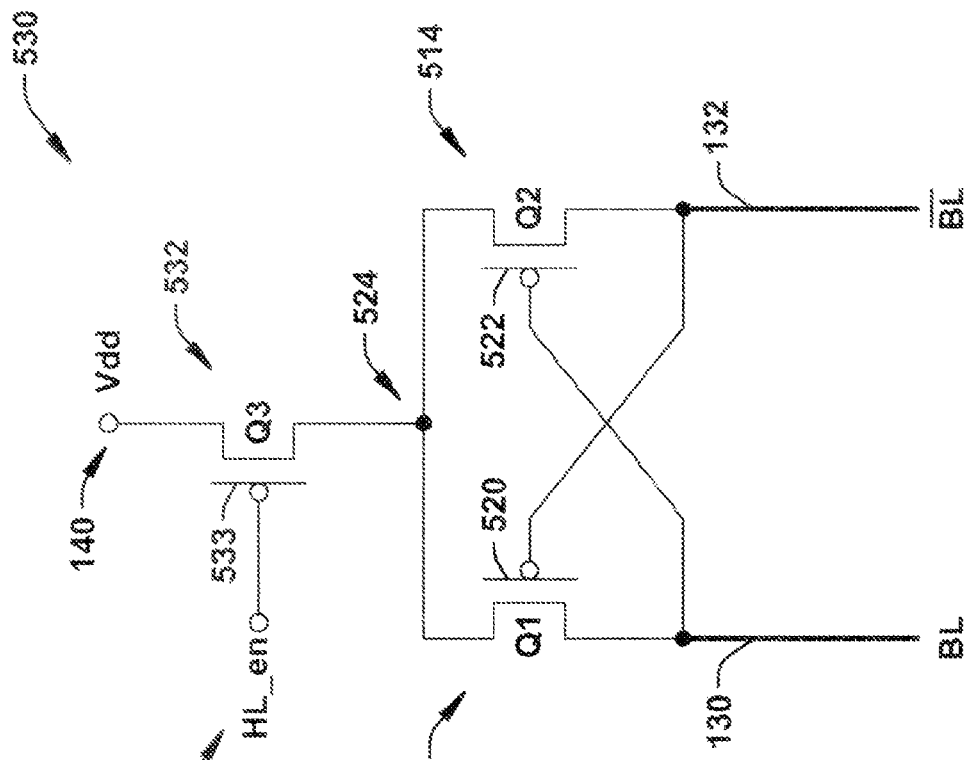
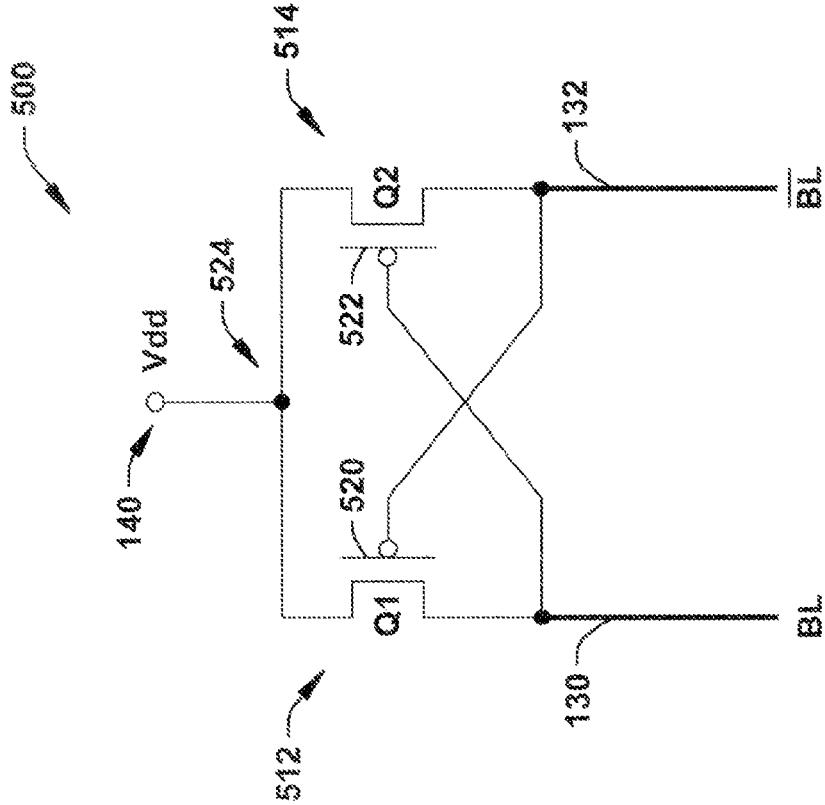
FIG. 5B
FIG. 5A

MEMORY ARRAY WITH A DELAYED WORDLINE BOOST

CROSS-REFERENCE TO RELATED APPLICATIONS AND PRIORITY

This application is a divisional application of Ser. No. 11/191,349, now U.S. Pat. No. 7,289,354 filed on Jul. 28, 2005.

FIELD OF INVENTION

The present invention relates generally to semiconductor memory devices and more particularly to an improved method of writing to an SRAM cell to improve the static noise margin and to avoid destabilizing unaddressed cells of the associated wordline during write operations in the manufacture of semiconductor products.

BACKGROUND OF THE INVENTION

Current trends in the semiconductor and electronics industry require memory devices to be made smaller, faster and require less power consumption. One reason for these trends is that more personal devices are being manufactured that are relatively small and portable, thereby relying on battery power. In addition to being smaller and more portable, personal devices are also requiring increased memory and more computational power and speed. In light of all these trends, there is an ever increasing demand in the industry for smaller, faster, and lower power dissipation memory cells and transistors used to provide the core functionality of these memory devices.

Semiconductor memories can, for example, be characterized as volatile random access memories (RAMs) or nonvolatile read only memories (ROMs), where RAMs can either be static (SRAM) or dynamic (DRAM) differing mainly in the manner by which they store a state of a bit. In SRAM, for example, each memory cell includes transistor-based circuitry that implements a bistable latch, which relies on transistor gain and positive (e.g., reinforcing) feedback so that it can only assume one of two possible states, namely on (state 1) or off (state 2). The latch can only be programmed or induced to change from one state to the other through the application of a voltage or other external stimuli. This arrangement is desirable for a memory cell since a state written to the cell will be retained until the cell is reprogrammed.

DRAMs on the other hand implement a capacitor that is either charged or discharged to store the on (state 1) or off (state 2) state of a cell. Capacitors discharge over time, however, and DRAMs must therefore be periodically "refreshed". Also, a bistable latch can generally be switched between states much faster than the amount of time it takes to charge or discharge a capacitor. Accordingly, SRAMs are a desirable type of memory for certain types of applications.

SRAM is typically arranged as a matrix of memory cells fabricated in an integrated circuit chip, and address decoding in the chip allows access to each cell for read/write functions. SRAM memory cells use active feedback from cross-coupled inverters in the form of a latch to store or "latch" a bit of information. These SRAM memory cells are often arranged in rows so that blocks of data such as words or bytes can be written or read simultaneously. Standard SRAM memory cells have many variations.

The basic CMOS SRAM cell generally includes two n-type or n-channel (nMOS) pull-down or drive transistors and two p-type (pMOS) pull-up or load transistors in a cross-coupled inverter configuration, with two additional nMOS select or pass-gate transistors added to make up a six-transistor cell (a 6T cell). Additionally, application specific SRAM cells can include an even greater number of transistors. A plurality of transistors are utilized in SRAM requiring matched electrical characteristics to provide predictable cell switching characteristics, reliable circuit performance, and minimize array power dissipation.

As transistor scaling trends continue, however, it becomes increasingly difficult to design a compact SRAM cell that has both adequate static noise margin (SNM) and also can be written into over the desired operating range of temperature, bias conditions, and process variations. The trip voltage (Vtrip) is essentially a measure of this ability of a cell to be written into. There is generally a trade-off between designing a cell to be stable (high SNM) and to be readily written into (high Vtrip). For example, if the pass gate is too strong relative to the drive transistor, SNM is degraded. If the pass gate is too weak relative to the load transistor, Vtrip is degraded. Also, if the load is too weak relative to the drive transistor, SNM is degraded. Generally, therefore, whatever improves SNM, also degrades Vtrip, and vice versa.

In addition, during write operations, the cells in the unaddressed columns in the accessed row are subject to upset, so any special bias conditions for the write operation must not lead to upset of the unaddressed cells. Thus, the current balance in cell design values often involves a trade-off that may translate to a higher incidence of data upsets and/or slower access times during cell read and write operations.

Accordingly, there is a need for an improved method of writing data into an SRAM cell in a manner that provides optimum static noise margin, while minimizing data upsets and power dissipation during write operations in the fabrication of SRAM memory devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to a method of writing to an SRAM memory cell structure (e.g., a 5T single ended or a6T differential SRAM memory cell) to provide improved static noise margin, and minimal risk of data upsets during write operations. The write method of the present invention permits these improvements by first quickly raising the wordline to a lower (e.g., read voltage) level, then after an optional time delay that allows the cells in the selected row to establish a stabilizing differential voltage on the associated bitlines, raising the wordline voltage to a boosted or higher (e.g., write voltage) level.

Alternately, the sequence of the write method or write operation (WRITE) and this wordline increase may be applied to the read operation (READ). Further, the voltage level used in a READ could be different (e.g., either higher or lower) from the intermediate voltage used in the WRITE. In the context of the present invention, the term "read voltage" will be used to identify a voltage level wherein the cell does not upset when the WL is at this level and when the bit lines (BL's) are at a precharge level. Alternatively, the READ may actually be accomplished with a WL voltage that is different from the word line voltage typically used during read operations.

A bitline enhancement circuit or structure is also described that is utilized in association with the method of the present invention to enhance or more quickly establish the differential voltage on the bitlines for improved cell stability. The methods and structure described herein are applicable to silicon wafer fabrication and other such fabrication processes in the manufacture of semiconductor memory devices.

In one aspect of the invention, the method comprises a wordline having two voltage levels for the selected wordline, wherein the lower or first voltage is used for read operations (read voltage) and the higher level or second (write voltage) for write operations. During write operations, the selected wordline is initially raised to the lower read voltage level. Then, after an optional time delay, the selected wordline is raised to the higher write voltage level. The optional delay is long enough to allow the cells in the selected row to establish a differential voltage on the associated bitline pair. With the differential voltage produced on the bitlines, the unaddressed cells will not be upset when the wordline is now raised further to a write voltage level, wherein the selected cells may be written to.

In one aspect of the invention, the optional time delay used for establishing the bit line differential to reduce the probability of upsetting the cell is based on or comparable to the read sensing delay used before the read sense amplifier is turned on during reading operations.

In another aspect of the invention, one or more intermediate voltages between the two wordline voltage levels are utilized during read or write operations, wherein the wordline is more gradually stepped from the read voltage level to the write voltage level.

In still another aspect, the wordline voltage is initially stepped or ramped to the read voltage level, then ramped to the write voltage level while the bitline differential is increasing.

In yet another aspect of the invention, the read voltage is the array Vdd voltage and the write voltage is above the Vdd voltage such as may be provided by a boost or charge pump circuit or another voltage supply.

In another aspect of the invention, the read voltage is lower than the array Vdd and the write voltage is the Vdd voltage, wherein the lower voltage is obtained from a voltage divider from the array Vdd.

In still another aspect of the invention, the bitline enhancement circuit comprises a sense amp or a half-latch for each column used to enhance the bitline differential before the write voltage or boosted voltage is applied to the wordline.

In yet another aspect of the invention, the bitline enhancement circuit comprises a sense amp or a half-latch for each column used to enhance the bitline differential substantially at the same time as the write voltage or boosted voltage is applied to the wordline.

In another aspect, based on the process corner, bias conditions, or temperature used in the fabrication process, one of the first and second wordline voltages is selectably eliminated from the method.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIGS. 5A and 5B are schematic diagrams of exemplary SRAM bitline enhancement circuits, comprising a half-latch used for enhancing the differential voltage on the bitlines during the write operations of FIGS. 2C and 2D according to several aspects of the present invention;

DETAILED DESCRIPTION OF THE INVENTION

Figure 1:
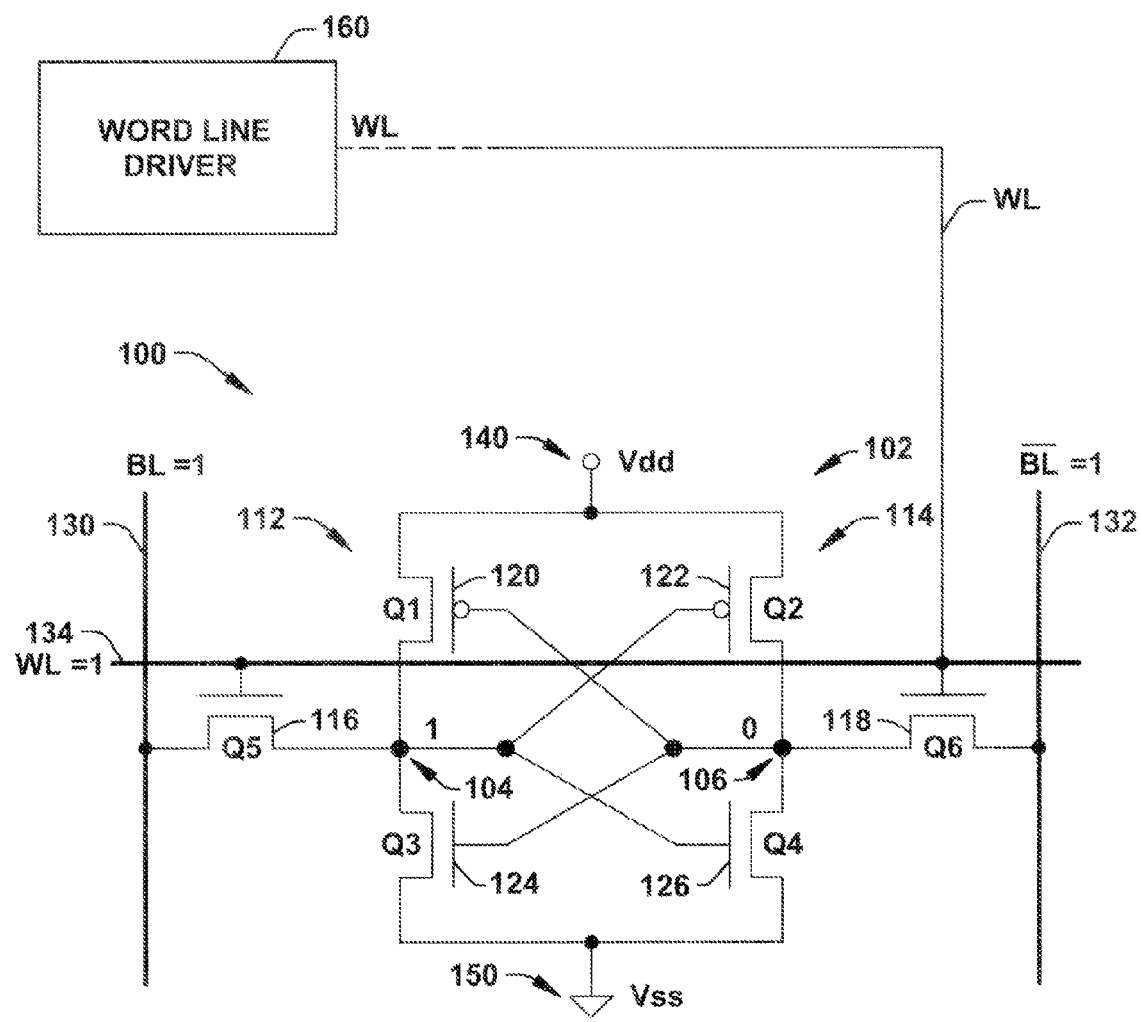
FIG. 1 is a schematic diagram of a 6T static random access memory (SRAM) cell such as may be used in accordance with the present invention.

The present invention will now be described with reference to the attached drawings, wherein like reference numerals are used to refer to like elements throughout. The invention provides an improved method and system for writing to an SRAM memory cell to increase static noise margin (SNM), while minimizing the risk of data upsets during write operations.

Because of transistor scaling trends, however, it becomes increasingly difficult to design a compact SRAM cell that has both adequate static noise margin (SNM) and adequate Vtrip over the desired operating range of temperature, bias conditions, and process variations.

The inventors of the present invention have appreciated that increasing the voltage of the wordline (WL) (e.g., a boosted wordline) would improve the Vtrip, but may then subject the unaddressed cells in the accessed row to a higher risk of upset. The inventors of the present invention have also discovered and appreciated that this increased risk of data upset diminishes dramatically with the imposition and increase of a differential voltage between the bitlines in a direction corresponding to the data state of the selected cell. Such a differential can be imposed on the bit lines associated with the unaddressed cells by the cells themselves. During a write operation, an unaddressed cell in the selected row is coupled by one or more pass gates to an associated bitline pair, for example, that have been both precharged to high states. The bitlines then receive charge from the cell based on the state voltages on the cell, wherein one of the bitlines of the initially precharged high bitline pair is pulled down.

Accordingly, one implementation of the present invention comprises accessing the selected row by first rapidly raising the wordline to a first voltage (V_rd) at which the cell has low probability of upset with the bit lines at the precharge voltage.

Typically, this voltage level (V_rd) is used during read operations. Then, after an optional delay period (t_dly) that allows the unaddressed cells on the accessed row to establish a differential voltage on the associated bit lines, for example, to a predetermined differential voltage (V_dx1), a higher (e.g., boosted, or write) wordline voltage (VWL_wrt) is then applied to the wordline. The predetermined differential voltage (V_dx1) is selected such that the bit line voltage will not cause the cell to upset with the higher word line voltage (VWL_wrt). Hereinafter, we refer to the reduction in the probability of upsetting the cell that comes about by the establishment of a differential voltage on the bit lines as stabilization of the cell. This "stabilization" comes about because of the change in the environment of the cell, and is not due to any change in the characteristics of the cell.

It should be noted that in a prior art 4T cell and method, raising the word line a little with the bit line high, changes the voltage in the cell to immediately make the cell more stable. By contrast, in the exemplary 6T cell and method used in accordance with the present invention, raising the word line voltage any amount with the bit line high tends to change the voltages in the cell in a direction to make the cell less stable. Subsequently, however, the 6T cells in the selected row establish or produce a differential voltage on the associated bit lines that reduce the probability of upsetting the cell(s).

Restated, in the prior art 4T cell and method, cell stabilization is immediately produced at the cell data nodes because of a word line increase. By contrast, in the 6T cell and method of the present invention, cell stabilization initially decreases with a word line increase, but over time, as the cell produces a differential voltage on the bit lines, cell stabilization is reestablished.

To better understand this, consider that the 4T cell relies on the pass gates as pull-ups for the data nodes toward the bit lines. After pre-charging the bit lines of the 4T cell, a small word line voltage increase produces a voltage divider action that causes a much greater voltage increase at the high-side data node than at the low-side data node, and increases cell stabilization. The 6T cell, however, has internal p-channel pull-ups on the data nodes to the Vdd potential. Thus, after pre-charging the bit lines of the 6T cell, any word line voltage increase effectively creates an additional pull-up toward the bit-lines that pulls-up to a greater extent on the low-side data node than on the high-side data node. This additional pull-up action tends to force the low-side data node to a high state that may upset the cell until a bit line difference is established. Thus, the 4T cell and method produces an internal data node difference that stabilizes the cell, while the 6T cell and method produces an external bit line difference that stabilizes the cell.

For these reasons, the amount of change and the rate of change that is permitted on the word line is tailored in the present invention to accommodate the 6T cell structure, or another such differential SRAM cell structure (e.g., an 8T or 10T cell) comprising cross-coupled amplifiers having internal pull-up transistors connected to a supply line (e.g., a drain power supply line).

After the higher voltage VWL_wrt has been asserted to the wordline, the bitline differential may increase further to a higher bitline differential voltage (V_dx2). In parallel, the WRITE circuitry imposes a differential voltage on the bitlines associated with the addressed cells in accordance with the data to be written. With the higher WL voltage, the desired state is securely imposed on the addressed cells.

In addition, the inventors of the present invention have realized that the differential voltage on the bitlines of an SRAM array may be enhanced by means of a sense amp or a half-latch circuit, for example. In the case of a half latch, with the bit lines initially precharged high and the precharge turned off as the WL is turned on, the half latch maintains or restores the one BL high as the second BL is pulled low by the associated cell. In the case of a sense amplifier, the sense amplifier can drive both bit lines, one high and the other low, in the sensed direction. This SRAM bitline enhancement circuit amplifies the differential voltage on the bit lines associated with the unaddressed cells on the accessed row, thereby further reducing the probability that the bit line voltage would upset the associated cell when the higher WL voltage is applied. The SRAM bitline enhancement circuit of the present invention is preferably implemented on a per column or on a bitline pair basis.

As a result, the risk of upsetting the unselected cells along a wordline (data upsets) is further minimized while Vtrip is made more robust by the higher WL voltage. With the enhancement of Vtrip by the higher WL voltage, as enabled by the stabilization of the unaddressed cells resulting from the BL differential reducing the probability of upset, it is possible to trade-off some Vtrip for improved SNM in the design of the cell, improving the robustness for READ. In addition, this arrangement may be useful to limit power dissipation in the array to the cell or cells that are accessed.

Exemplary implementations are hereinafter illustrated and described in the context of fabricating SRAM cell circuits and methods to improve the SNM of a conventional 6T SRAM cell, particularly in highly scaled memory arrays, and to avoid write data upsets, wherein the structures illustrated are not necessarily drawn to scale. Although a differential 6T SRAM cell accessed from bitline pairs is discussed and illustrated in the context of the present invention, a single sided 5T SRAM cell accessed from a single bitline and other such cells may also utilize the methods and circuits illustrated herein, and are contemplated. Further, it will be appreciated that the invention may be employed in the fabrication of SRAM memory devices, silicon wafer fabrication and other such fabrication processes in the manufacture of semiconductor memory devices, and other such processes apart from the exemplary memory structures described and illustrated herein. These and other benefits will become more apparent as the following figures are described infra.

Beginning at FIG. 1 a conventional 6T SRAM cell 100 is illustrated comprising a differential 6T static random access memory (SRAM) cell 100, such as may be used in association with the present invention. As illustrated, the SRAM cell 100 comprises a data storage cell or latch 102, generally including a pair of cross-coupled inverters, for example, inverter 112, and inverter 114, the latch 102 operable to store a data bit state. FIG. 1, illustrates that the bit is stored in the latch 102 at the data nodes or first and second latch nodes 104 and 106, respectively, having a high or "1" state and a low or "0" state, respectively. Cell 100 also comprises a pair of wordline pass transistors 116, 118 to read and write the data bit between the cross-coupled inverters 112, 114 and bitlines BL 103, BL-bar 132, when enabled by wordline 134.

Respective inverters 112, 114 comprise a p-type MOS (pMOS) pull-up or load transistor Q1 120, Q2 122 and an n-type (nMOS) pull-down transistor Q3 124, Q4 126. Pass transistors Q5 116, Q6 118 are n-channel as well, which generally supply higher conductance than p-channel transistors. Pass transistors 116, 118 are enabled by wordline 134 and accessed by bitlines 130, 132 to set or sense the SRAM latch 100. FIG. 1 further illustrates that inverters 112, 114 of the SRAM memory cell 100 are connected together to a Vdd drain power supply line 140 and a Vss source power supply line 150.

The differential 6T SRAM cell comprises six transistors and is termed a 6T full CMOS SRAM cell. When the channels of all the transistors are formed in the single crystal silicon substrate, it is called a single crystalline bulk CMOS 6T SRAM cell. It is also referred to as a planar SRAM cell when all the transistors are made in the same substrate material (e.g., bulk crystalline silicon, SOI, etc.).

In general, SRAM cells are more stable and have better data retention where the respective pMOS (120, 122) and nMOS (124, 126) transistors are load balanced and matched for the two inverters (112, 114). However, as dimensions are reduced to scale down devices, it becomes increasingly difficult to achieve a balance in the relative strengths of the pass gate, drive, and load transistors over the desired range of temperature, bias conditions, and process variations, as well achieving matched transistor characteristics. As a result, SRAM cells formed as such can be adversely affected by varying operating characteristics and may be unstable and may not retain the desired bit state, during read or write operations.

During conventional read or write operations, bitlines 130 and 132 are initially precharged to a high or "1" state. A read voltage is asserted to wordline WL 134 during a read or a write operation to activate pass transistors Q5 116 and Q6 118 into conduction, whereby latch 102 may be accessed by bitlines 130 and 132, respectively. With the prior data states as shown in FIG. 1, an exemplary high state "1" is on latch node 104 at the gate of Q4 126, and a low state "0" is on latch node 106 at the gate of Q3 124. With these data states, only Q4 126 on the "low side" conducts via latch node 106, and pulls bitline-bar 132 lower, while Q3 124 on the "high side" does not conduct and thus, leaves bitline 130 high. Thus, given a finite amount of time, the cell will increasingly establish a greater differential voltage between the bitlines 130 and 132, which increasingly stabilizes the data state of the cell, and reduces the probability of a data upset on the cell.

In accordance with the present invention, a wordline driver 160 is used to control and drive the wordline WL 134 of SRAM cell 100. Word line driver 160 controls an increase and a timing of the increase of the word line voltage applied to the word line of accessed SRAM cell 100. This word line control allows the accessed cell time to establish a voltage of an associated bit line prior to the word line reaching a full word line voltage. In this way, the voltage that is established on the bit line increases the stability of the cell as the word line voltage approaches the full word line voltage.

In one implementation of the present invention, an array of SRAM memory cells (e.g., cell 100 of FIG. 1) is arranged in rows and columns. The SRAM array has a plurality of wordlines associated with the rows of cells of the array, a plurality of bit lines associated with the columns of cells of the array, and a word line driver operable to be coupled to a selected one of the plurality of wordlines for driving the voltage on the selected word line of the array. The wordline driver 160, is further operable to control the word line voltage by increasing the word line from a non-accessed state of the word line to a first voltage level, then after a time delay, increasing to a second voltage level, wherein the second voltage level is greater than the first voltage level of the word line. Again, the voltage imposed on the bit line by the accessed cell increases the stability of the cell prior to the word line being driven to the full access voltage.

FIGS. 2A-2D illustrate exemplary methods 200a-200d, respectively, of operating an SRAM memory cell similar to cell 100 of FIG. 1 during a write operation in accordance with several aspects of the present invention.

Figure 2A:
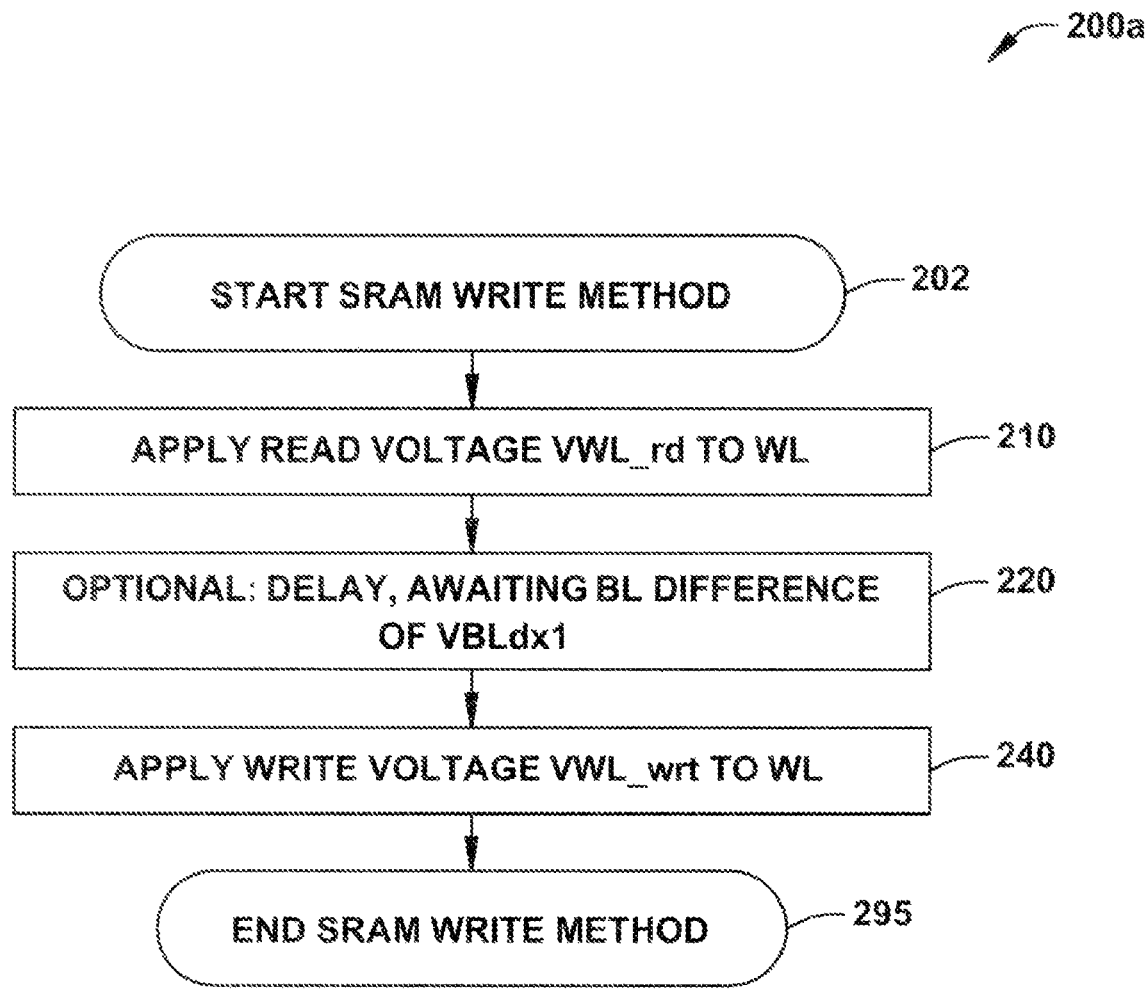
FIGS. 2A-2D are flow diagrams of methods of writing to an SRAM memory cell similar to that of FIG. 1 during a write operation in accordance with several aspects of the present invention.

FIG. 2A, for example, illustrates an exemplary write method 200a for writing to the conventional 6T SRAM cell 100 of FIG. 1. Method 200a utilizes a lower read wordline voltage and a higher write wordline voltage, and optionally, a time delay therebetween to allow the differential voltage on the bitlines to increase, in order to reduce the probability of cell upset according to one or more aspects of the present invention. Optionally, the bit line differential may be established in parallel with the word line voltage increase, for example, as in the case of a ramped word line voltage increase. The lower or read wordline voltage (VWL_rd) may be conventionally used for read operations and the higher level write wordline voltage (VWL_wrt) is used for write operations. For example, in one aspect of the invention, the lower read wordline voltage may be at Vdd and the higher write wordline voltage at a boosted level above Vdd. Alternately, for example, the read wordline voltage may below Vdd, and the write wordline voltage at Vdd. Other variations of this concept are anticipated in the context of the present invention.

Figure 3A:
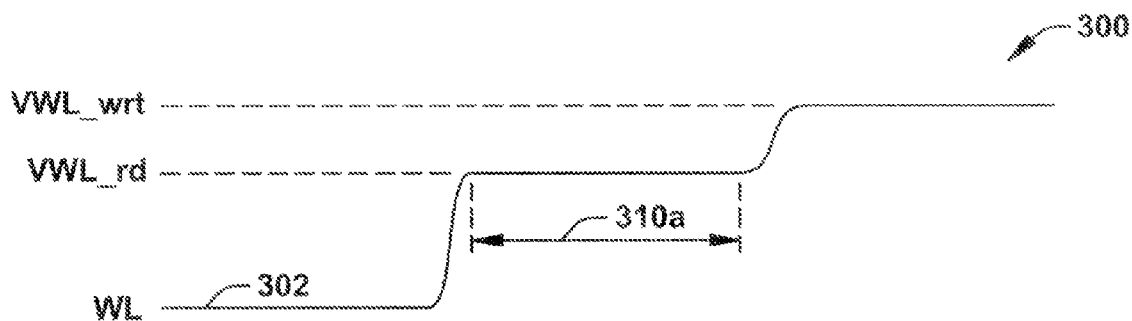
FIGS. 3A-3D are simplified plots of various wordline voltage profiles that may be asserted to an SRAM memory cell during a write operation in accordance with the methods of FIGS. 2A-2D.
Figure 3B:
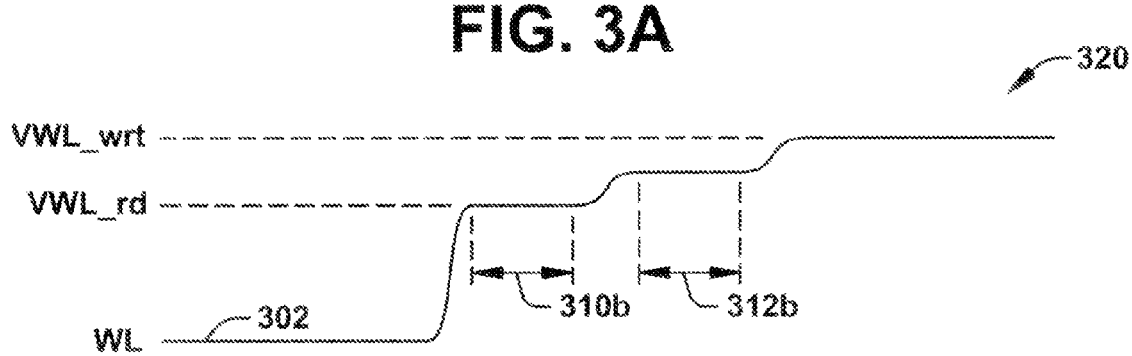

FIGS. 3A and 3B illustrates exemplary waveforms comprising these two wordline voltages as will be discussed further infra. As illustrated in FIG. 3B, one or more intermediate voltages between the two wordline voltage levels may be utilized during write operations of the present invention, wherein the wordline is more gradually stepped from the read voltage level to the write voltage level.

Prior to writing to a selected cell(s), the associated bitline pairs are precharged to a high "1" state. The SRAM write method 200a begins at 202, wherein the cell to be written into is accessed at 210, by first rapidly raising the associated wordline to the read wordline voltage level VWL_rd that may also be used during read operations. Then at 220, an optional time delay period (t_dly) permits the voltage differential on the associated bitlines to increase to a more stabilizing differential voltage, for example, to a predetermined differential voltage (V_dx1). In one aspect of the invention, the time delay t_dly used for improving the bitline differential for stabilization of the cell is comparable to the read sensing delay used before the read sense amplifier is turned-on during reading operations. The selected cell(s) in the selected row establish (e.g., charge/discharge, pull-up/pull-down) a differential voltage onto the associated bitline pairs in the same direction as the data states on the respective selected cell(s). Optionally, the bit line differential may be established in parallel with the word line voltage increase, for example, as in the case of a ramped word line voltage increase.

With the differential voltage now established on the bitlines, the unaddressed cells of the wordline will not be upset when the wordline is raised further to the write voltage level VWL_wrt. At 240, the selected wordline is then raised again (e.g., multiple stepwise increases, a ramping increase, or another such gradual increase wherein the VWL slope is non-zero) to the higher (e.g., boosted) write voltage level VWL_wrt, and in response, the bitline differential may increase further to a still higher bitline differential voltage (V_dx2), as will be discussed and illustrated in FIG. 4 infra. Finally, the SRAM write method 200a ends at 295 of FIG. 2A, and subsequently the selected cell(s) (e.g., cell 100 of FIG. 1) may be written to.

Figure 2B:
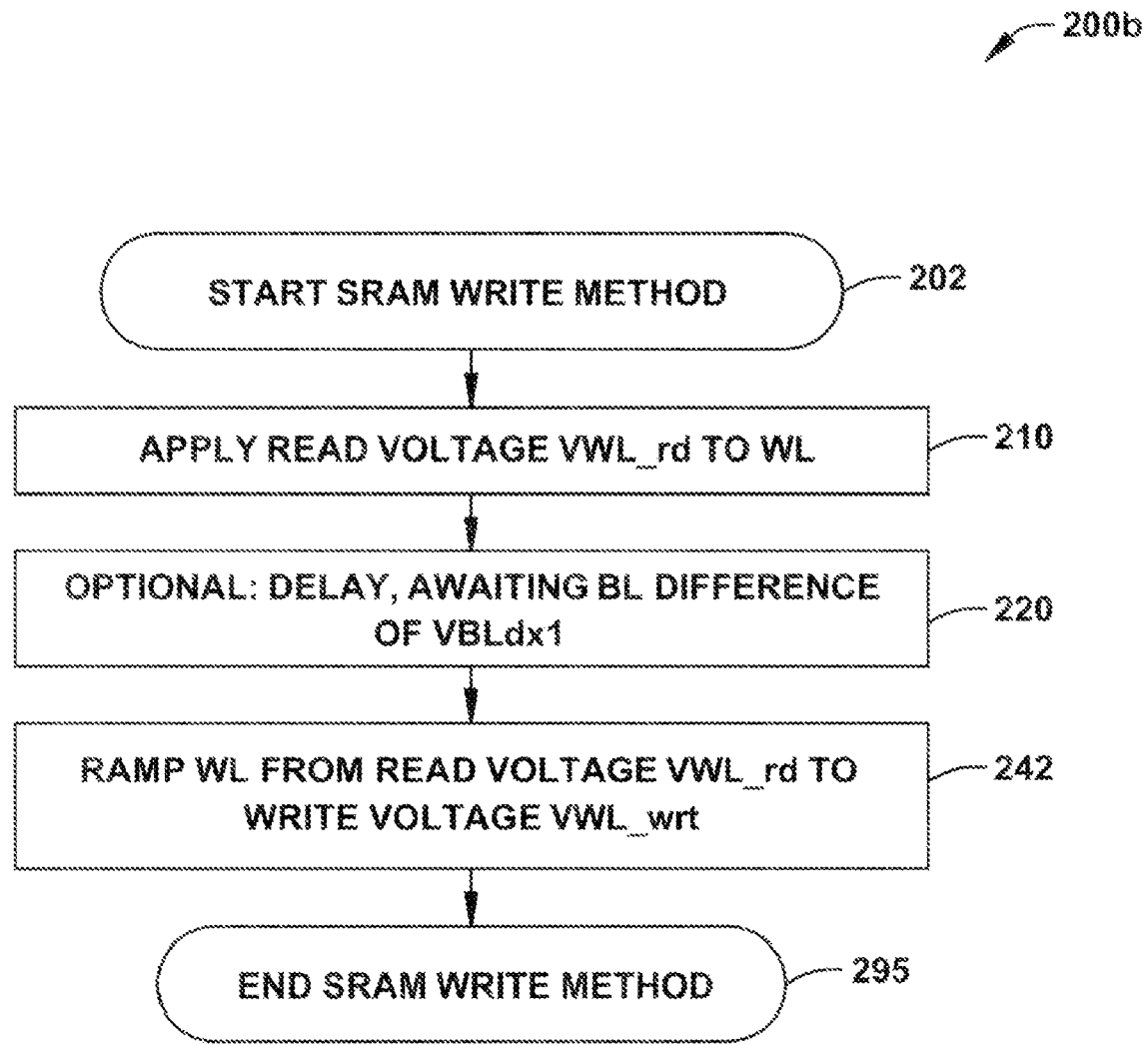

FIG. 2B illustrates another exemplary write method 200b for writing to the conventional 6T SRAM cell 100 of FIG. 1. Method 200b utilizes a lower read wordline voltage VWL_rd and a gradually increasing or ramping write wordline voltage VWL_wrt, and an optional minimal time delay therebetween.

The ramping write wordline voltage compensates for this minimal time delay by allowing the voltage differential on the bitlines to gradually increase in order to improve stabilization of the cell according to one or more aspects of the present invention. Example waveforms comprising these ramping wordline voltages will be discussed and illustrated further in FIGS. 3C and 3D infra. Again, the lower read wordline voltage (VWL_rd) may be conventionally used for read operations and the higher level (e.g., boosted) write wordline voltage (VWL_wrt) is used for write operations.

Prior to writing to selected cell(s), the associated bitline pairs are precharged to a high "1" state. The SRAM write method 200b begins at 202, wherein the cell to be written into is accessed at 210, by first rapidly raising the associated wordline to the read wordline voltage level VWL_rd that may also be used during read operations. Then at 220, a brief time delay period (t_dly) is used that permits the voltage differential on the associated bitlines to increase to a more stabilizing differential voltage, for example, to a predetermined differential voltage (V_dx1). In one aspect of the invention, the time delay t_dly used for improving bitline differential for stabilization of the cell is less than or equal to the read sensing delay used before the read sense amplifier is turned-on during reading operations.

With some differential voltage now established on the bitlines, the unaddressed cells of the wordline will not be upset when the wordline is gradually raised further to the write voltage level VWL_wrt. At 242, the selected wordline is then gradually ramped to the higher (e.g., boosted) write voltage level VWL_wrt, and in response, the bitline differential may increase further to a still higher bitline differential voltage (V_dx2), as will be discussed and illustrated in FIG. 4 infra. Finally, the SRAM write method 200b ends at 295 of FIG. 2B, and subsequently the selected cell(s) (e.g., cell 100 of FIG. 1) may be written to.

Figure 2C:
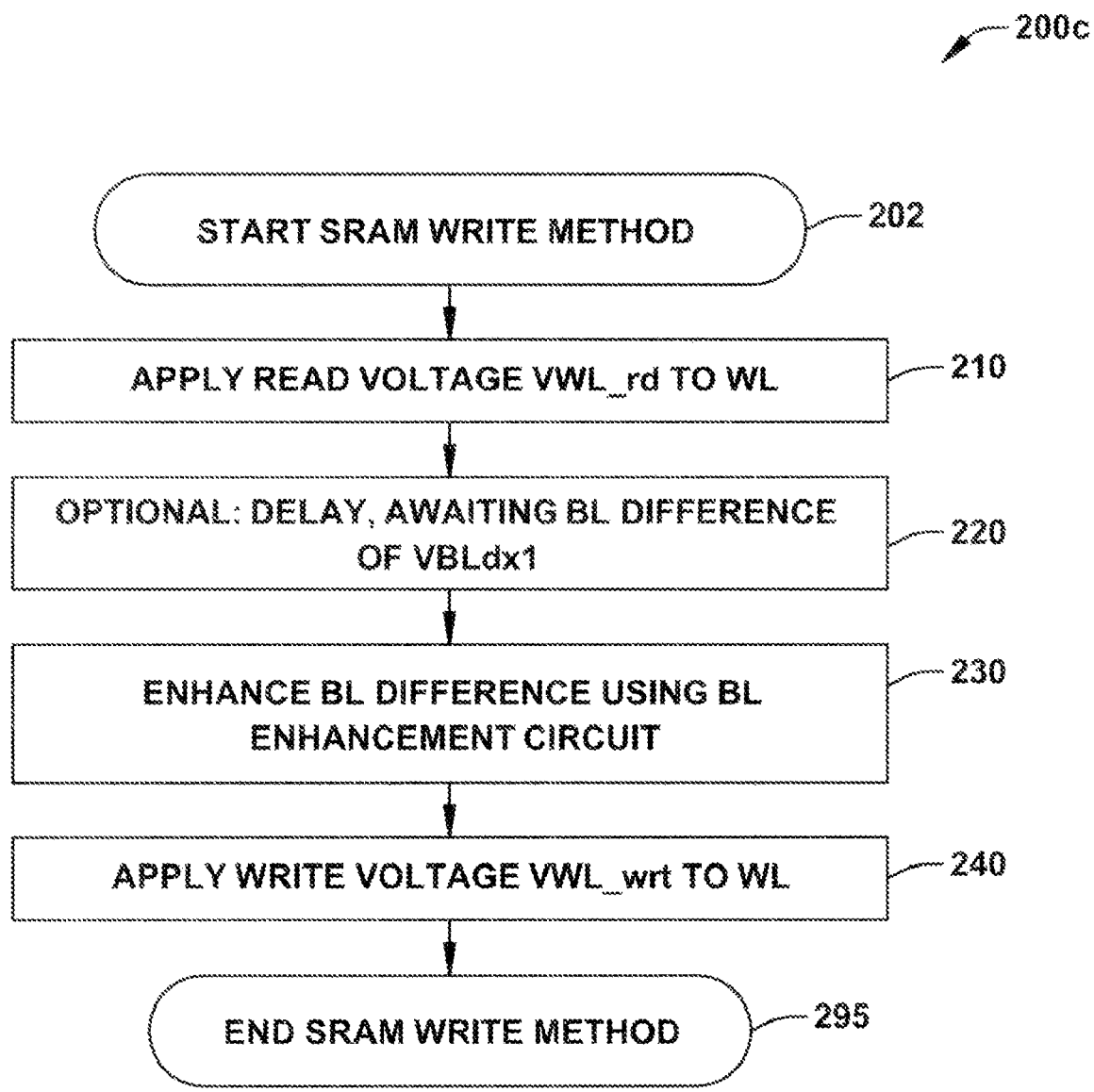
Figure 2D:
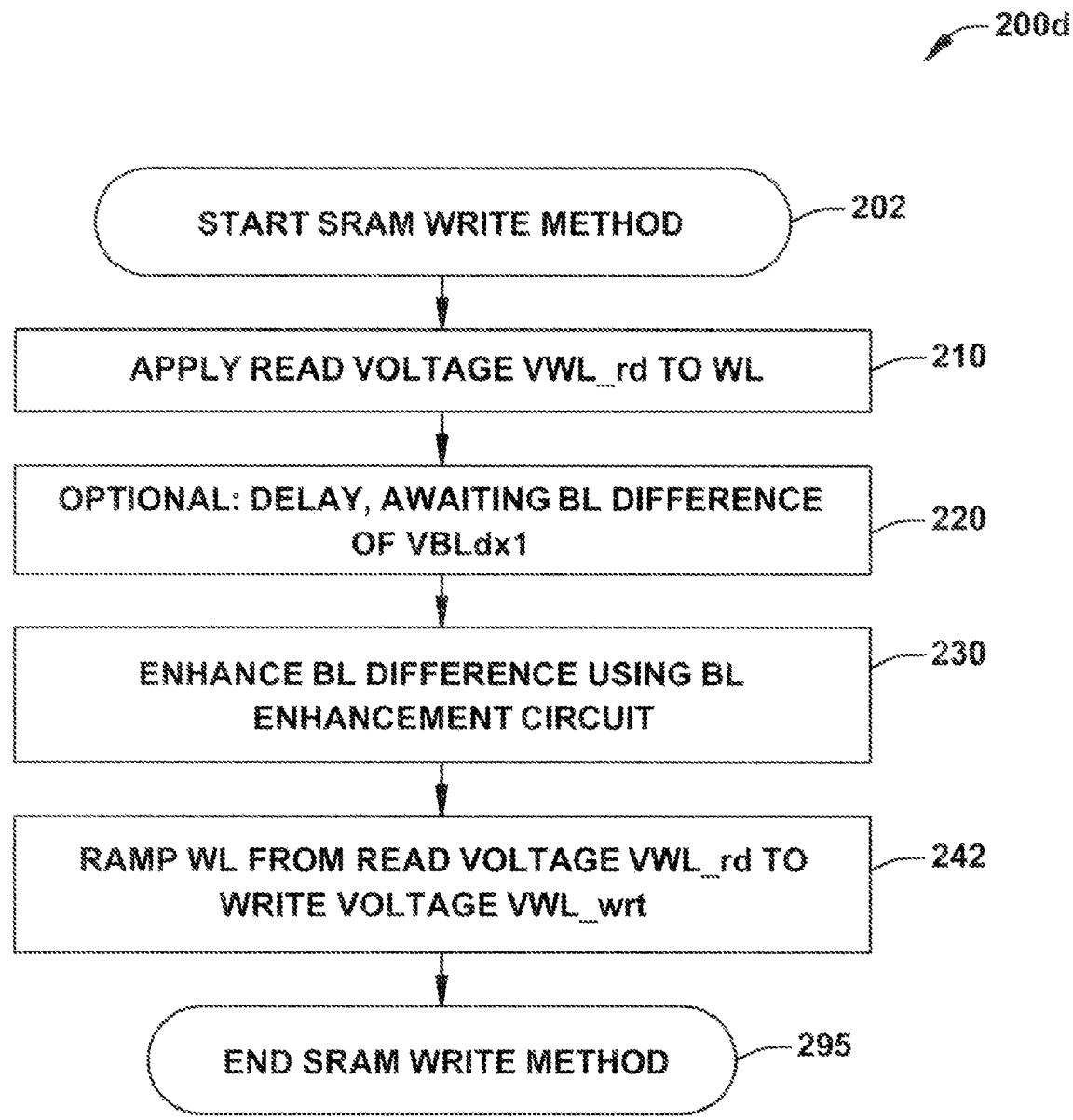

Methods 200c and 200d, of FIGS. 2C and 2D, respectively, are similar to those of FIGS. 2A and 2B, respectively, except that a bitline enhancement circuit is further utilized in accordance with another aspect of the present invention. The bitline enhancement circuit comprises, for example, a sense amplifier or a half-latch connected (e.g., to each column) to enhance or amplify the bitline differential before the write wordline voltage is applied to the wordline. By amplifying the data state of the cell to the bitline, the initial differential established by the cell is maintained or increased, thereby enhancing the stabilization of the cell and allowing a higher WL voltage while permitting a more rapid increase to the higher WL voltage.

For example, method 200c of FIG. 2C and method 200d of FIG. 2D, add to method 200a of FIG. 2A and method 200b of FIG. 2B, respectively, a step 230 of enhancing the bitline difference using a bitline enhancement circuit to maintain or to increase the bitline differential at an accelerated rate.

In the methods of FIGS. 2A-2D, one of the read or write wordline voltages may be selectably eliminated from the method based on the process corner, bias conditions, or temperature. For example, if it is discovered in wafer testing that the memory cells have a low Vtrip and a correspondingly high SNM, as may be the case when the cells have relatively weak n-channel and stronger p-channel transistors, then a fuse selection may be made to go directly to the higher write wordline voltage without delay.

FIGS. 3A-3D illustrate various wordline voltage waveforms that may be asserted to a wordline (of an SRAM memory cell (e.g., cell 100 of FIG. 1) during a write operation in accordance with the methods of FIGS. 2A-2D.

FIG. 3A, for example, illustrate a wordline wave form 300 comprising two wordline voltage levels, applied to a wordline 134 of cell 100, in accordance with the methods of FIG. 2A or 2C. Wordline waveform 300 begins at an unaccessed potential 302 and then rapidly rises to a read wordline voltage level VWL_rd to access the cell 100. After an optional time delay t_dly 310a, the bitline differential has increased to a bitline differential voltage of VBL_dx1, whereby the probability of cell upset is decreased enough to allow a further wordline voltage increase to VWL_wrt. Accordingly, as the BL voltage differential increases, a higher WL voltage can be applied without cell upset.

FIG. 3B, illustrates a wordline waveform 320 comprising three wordline voltage levels, applied to a wordline 134 of cell 100, in accordance with the methods of FIG. 2A or 2C. Wordline waveform 320 begins at an unaccessed potential 302 and then rapidly rises to a read wordline voltage level VWL_rd to access the cell 100. After an optional first time delay t_dly 310b, the bitline differential has increased to a bitline differential voltage of VBL_dx1, whereby the stabilization of the cell is improved enough to allow an increase to an intermediate write voltage level. The intermediate write voltage level increase is followed by an optional second time delay t_dly 312b, a differential voltage increase to VBL_dx2, and a corresponding second cell stabilization improvement to permit a final wordline voltage increase to VWL_wrt for a robust WRITE into the addressed cells. Accordingly, again, as the BL voltage differential increases, a higher WL voltage can be applied without cell upset.

Figure 3C:
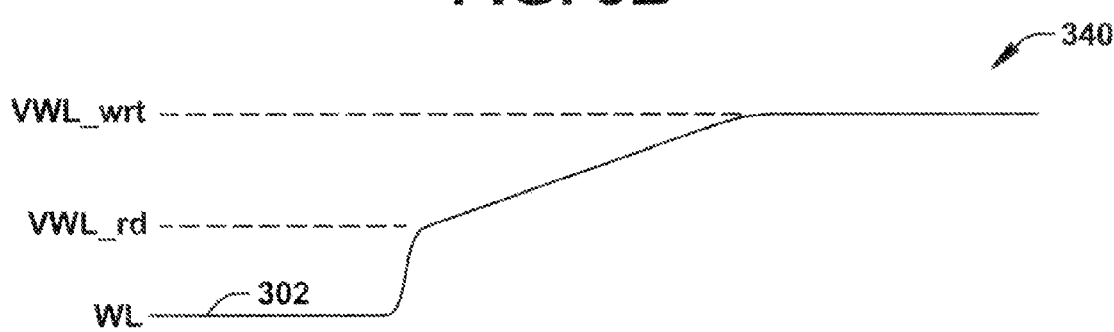
Figure 3D:
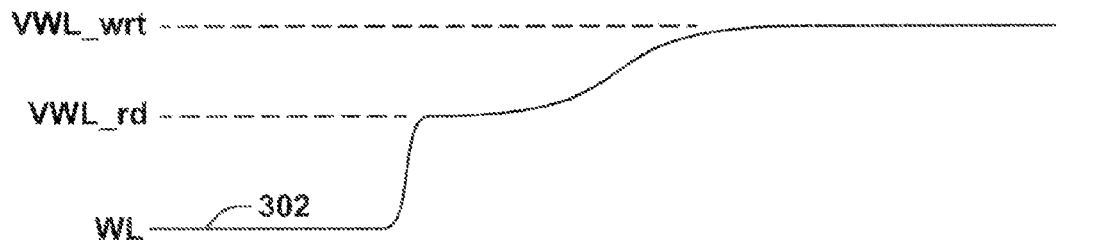

FIGS. 3C and 3D, illustrate a wordline waveform 340 and 360, respectively, comprising two wordline voltage levels and a ramping increase therebetween, applied to a wordline 134 of cell 100, in accordance with the methods of FIG. 2B or 2D. Wordline waveforms 340 and 360 begin at an unaccessed potential 302 and then rapidly rise to a read wordline voltage level VWL_rd to access the cell 100. After the bitline differential has increased to a bitline differential voltage of VBL_dx1, the stabilization of the cell is improved enough to allow a gradually ramped increase to a final wordline voltage VWL_wrt for a robust WRITE into the addressed cells. Accordingly, again, as the BL voltage differential increases, a higher WL voltage can be applied without cell upset.

Figure 4:
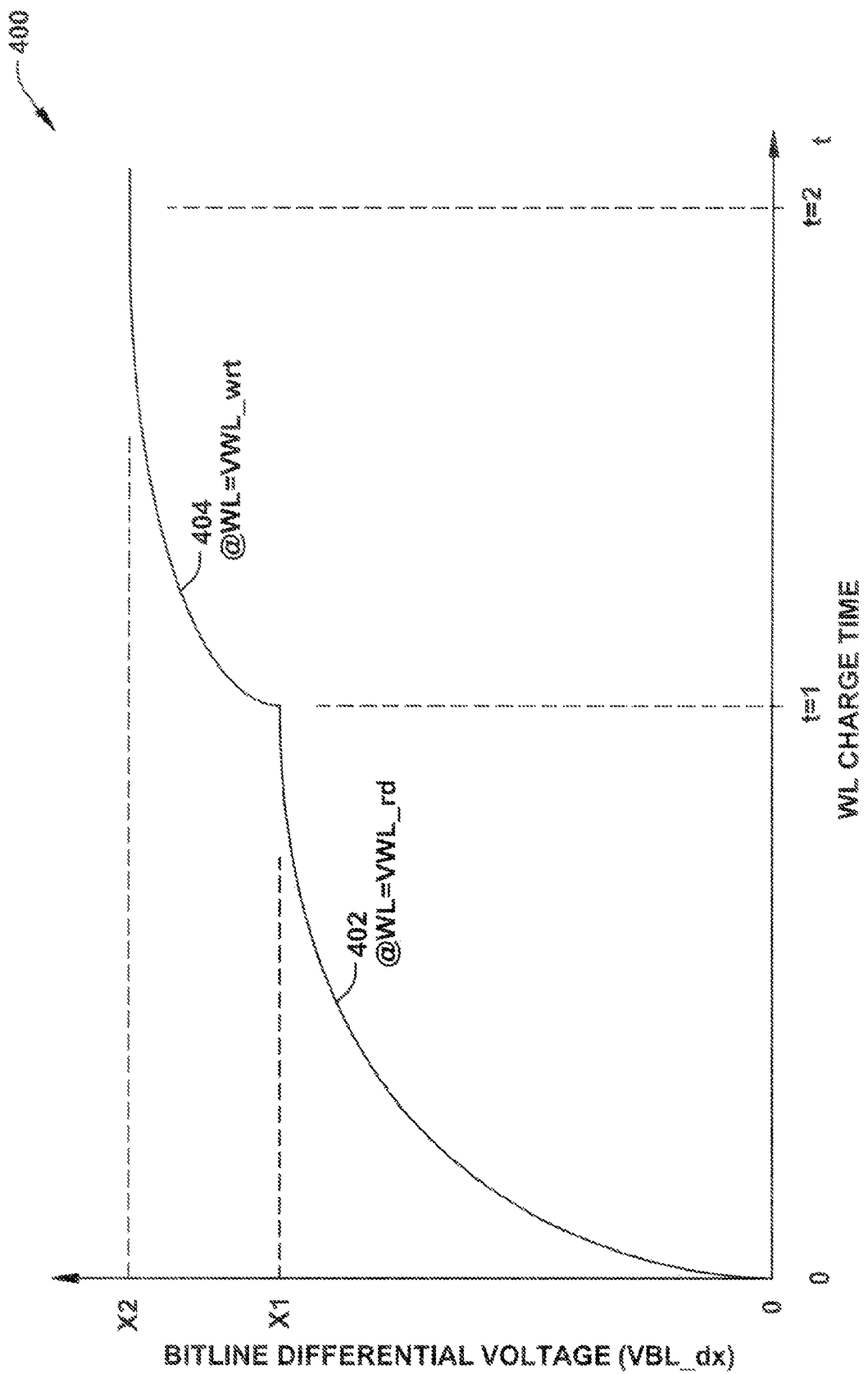
FIG. 4 is a simplified plot of the bitline differential voltage that occurs when the wordline voltage profile of FIG. 3A is asserted to an SRAM memory cell similar to that of FIG. 1 during a write operation in accordance with the methods of FIGS. 2A and 2C.

FIG. 4 illustrates an exemplary bitline differential voltage VBL_dx 400 that occurs when the wordline voltage waveform 300 of FIG. 3A is asserted to wordline 134 of an SRAM memory cell similar to cell 100 of FIG. 1 during a write operation in accordance with the methods of FIGS. 2A and 2C. The bitline differential voltage VBL_dx 400 comprises a read wordline voltage VWL_rd induced portion 402 and a write wordline voltage VWL_wrt induced portion 404.

With both bitlines 130 and 134 precharged to a high "1" state, the bitline differential voltage VBL_dx 400 is initially 0 volts at time t=0. As the read wordline voltage VWL_rd is rapidly asserted to wordline 134, the bitline differential voltage VBL_dx 402 charges during time delay t_dly (e.g., 310a of FIG. 3A) toward VBL_dx1 at t=1. With the differential voltage VBL_dx1 now well established on the bitlines 130 and 132 at t=1, the write wordline voltage VWL_wrt may now be safely asserted to the wordline 134 with little risk of data upset. Thereafter, the bitline differential voltage VBL_dx 404 increases further toward VBL_dx2 at t=2, which increases the cell stabilization further.

FIGS. 5A and 5B illustrate exemplary SRAM bitline enhancement circuits 500 and 530, respectively, comprising a half-latch used for enhancing the differential voltage on the bitlines of an SRAM array of memory cells during the write operations of FIGS. 2C or 2D, according to several aspects of the present invention. The SRAM memory cell (e.g., cell 100 of FIG. 1) comprises first and second cross-coupled inverters 112 and 114, respectively, connected to first and second latch nodes 104 and 106, respectively, and first and second pass transistors 116 and 118, respectively. The first and second pass transistors 116 and 118, respectively, are connected between the first and second latch nodes 104 and 106, and the respective first and second bitlines 130 and 132 of the array.

SRAM bitline enhancement circuit 500 further comprises first and second cross coupled pull-up circuits 512 and 514, respectively, for example, the p-channel pull-up transistors Q1 520 and Q2 522, arranged in the half-latch type configuration. First and second cross coupled pull-up circuits 512 and 514, are connected between a supply node 524 and first and second bitlines 130 and 132, respectively, wherein an output of the first pull-up circuit 512 is connected to the first bitline 130, and an output of the second pull-up circuit 514 is connected to the second bitline 132. In addition, an input of the first pull-up circuit 512 is connected to the second bitline 132 and an input of the second pull-up circuit 514 is connected to the first bitline 130.

SRAM bitline enhancement circuit 530 further comprises a pull-up or enable device 532 (e.g., p-channel transistor Q3 533), series connected between the supply node 524 and a power supply terminal 140 for pull-up of the supply node 524 toward the level of a power supply voltage (e.g., Vdd). A half-latch enable signal HL_en 540, asserted to an input terminal of the pull-up device 532, enables the half-latch circuit 500 of enhancement circuit 530.

During write operations of the SRAM bitline enhancement circuits 500 or 530, an SRAM memory cell of the array is selected for write operations by initially precharging associated bitlines 130 and 132 in a high "1" state. The precharge is then turned-off and the wordline is activated by raising the associated wordline 134 first to a read wordline voltage level VWL_rd. The read wordline voltage VWL_rd causes pass transistors 116 and 118 to conduct and couple data nodes 104 and 106 of latch 102 to bitlines 130 and 132, respectively.

With the wordline now activated, the half-latch circuit portion 500 of enhancement circuit 530 is then enabled by the half-latch enable signal HL_en 540. Enhancement circuit 500 is the preferable implementation of such a circuit, having one less transistor. However, without the benefit of the pull-up or enable device 532, the timing and order of the above mentioned signals may need to be customized to facilitate the enhancement circuit 500.

Once the cell is accessed by the wordline and the enhancement circuit 500, 530 is enabled, the present data state of the latch nodes 104 and 106 of the selected cell, begins to produce a differential voltage on the bitlines relative to their original precharged high "1" states. As the WL is turned on, an accessed cell pulls low one of the precharged high bit lines. The half latch keeps the other associated BL high. If the initial precharge voltage is not fully high, or if the BL voltage sags after precharge, due to leakage currents, the half latch can impose a full high voltage on the BL that is not pulled low by the cell. As indicated previously, these bitline voltages are established in the same direction as the data states on the latch nodes 104 and 106 of the cell 100.

In one embodiment, the bit line enhancement circuits are not enabled for the columns addressed for WRITE. In an alternative embodiment, the bitline enhancement circuits are initially enabled and then disabled prior to the driving of the BLs by the WRITE circuitry. In a third embodiment, the WRITE drivers are designed to overpower the bitline enhancement circuit. In a fourth embodiment, the WRITE driver initiates a differential on the addressed bit lines prior to enabling the bit line enhancement circuit.

Figure 6:
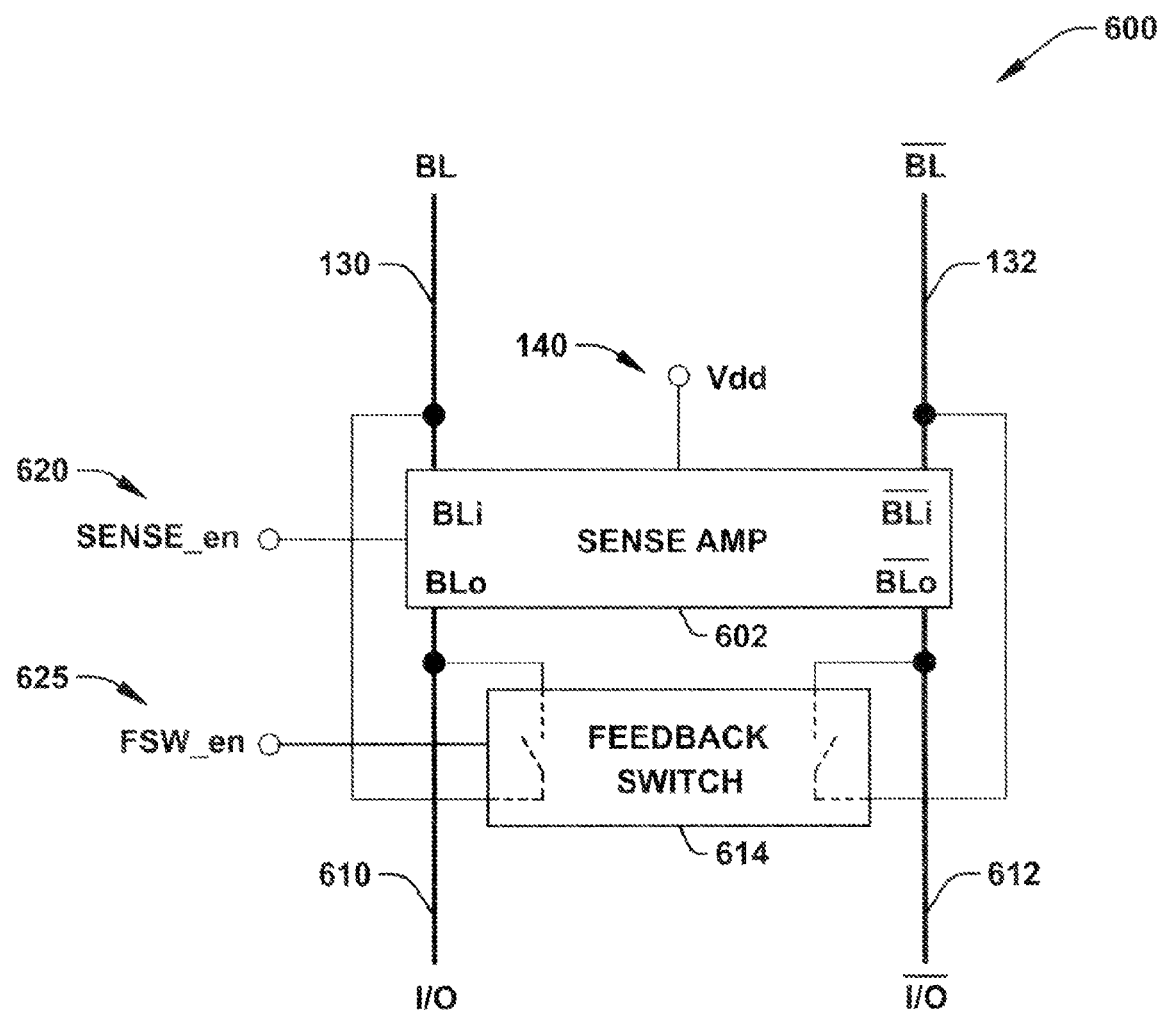
FIG. 6 is a schematic diagram of an exemplary SRAM bitline enhancement circuit, comprising a sense amplifier used for enhancing the differential voltage on the bitlines during the write operations of FIGS. 2C and 2D according to several aspects of the present invention.

FIG. 6 illustrates another exemplary SRAM bitline enhancement circuit 600, comprising a sense amplifier used for enhancing the differential voltage on the bitlines of an SRAM array of memory cells during the write operations of FIGS. 2C and 2D, according to several aspects of the present invention.

The SRAM memory cell (e.g., cell 100 of FIG. 1) comprises first and second cross-coupled inverters 112 and 114, respectively, connected to first and second latch nodes 104 and 106, respectively, and first and second pass transistors 116 and 118, respectively. The first and second pass transistors 116 and 118, respectively, are connected between the first and second latch nodes 104 and 106, and the respective first and second bitlines 130 and 132 of the array.

SRAM bitline enhancement circuit 600 also comprises a sense amplifier 602 connected between a pair of bitlines 130, 132 associated with the selected cell 100 and a pair of I/O lines 610 and 612, respectively. SRAM bitline enhancement circuit 600 further comprises a feedback switch 614 connected between the I/O lines 610, 612 at the output of the sense amplifier 602 and the bitlines 130 and 132, respectively.

The exemplary SRAM bitline enhancement circuit 600 further comprises a sense amp enable signal SENSE_en 620 to activate the sense amplifier 602, and a feedback switch enable signal FSW_en 625 to enable the feedback switch circuit 614. During bitline enhancement operations, and enabled by SENSE_en 620 and FSW_en 625, the feedback switch 614 couples the I/O lines 610 and 612, at the output of the sense amp 602, to the bitlines 130 and 132, respectively, at the input of the sense amp 602.

Although the 6T SRAM cell 100 of FIG. 1 has been discussed in the context of a differential memory cell for access to differential bitlines in accordance with the methods of the present invention, it is appreciated by the inventor that a single sided SRAM cell (e.g., a 5T cell) having access to a single bitline may also be utilized. Accordingly, the single sided SRAM cell write method would apply a similar concept of utilizing both read and write voltages during the write operation, and/or a similar single column bitline enhancement circuit for amplifying the bitline voltage during the write operation. Further, other such cell and transistor technology variations, including array, bitline, or wordline orientation variations are anticipated in the context of the present invention.

The invention is also not limited to the use of silicon wafers, and may be implemented in association with the manufacture of various semiconductor devices, SRAM memory devices, or other such devices, wherein the design and optimization of an SRAM cell, potential data upsets, and power consumption is an issue, where cell access is to be limited only to the memory area being used, wherein cell size and patterning considerations are problematic, and wherein the various aspects thereof may be applied.

While the invention has been described to have a higher WL voltage for the WRITE than for the READ, the WL voltage sequence can be used for the READ as well as for the WRITE.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. An integrated circuit comprising:
  an array of SRAM memory cells arranged in rows and columns, the SRAM cell comprising cross-coupled amplifiers having internal pull-up transistors connected to a supply line;
  a plurality of wordlines associated with the rows of cells of the array;
  a plurality of bit lines associated with the columns of cells of the array;
  a word line driver operable to drive a selected word line of the array, wherein the wordline driver is further operable to:
    during a write operation, access the selected wordline associated with the SRAM memory cell by asserting a read wordline voltage to the selected wordline;
    generate a bit line difference voltage on the bit lines; and
    assert a write wordline voltage after generation of the bit line difference voltage to the selected wordline of the memory cell during the write operation;
  wherein the bit line difference voltage imposed on the bit line by an accessed cell increases the stability of the cell prior to the word line being driven to a full access voltage.

2. The circuit of claim 1, further comprising an SRAM bitline enhancement circuit for an SRAM memory array, for enhancing the differential voltage produced by an SRAM memory cell of the array on associated first and second bitlines of the array, the SRAM memory cell comprising first and second cross-coupled inverters connected to first and second latch nodes, respectively, and first and second pass transistors connected between the first and second latch nodes and the respective first and second bitlines of the array, the SRAM bitline enhancement circuit comprising:
  first and second cross-coupled pull-ups connected between a supply node and first and second bitlines, respectively;
  wherein an output of the first pull-up is connected to the first bitline, and an output of the second pull-up is connected to the second bitline; and
  wherein an input of the first pull-up is connected to the second bitline and an input of the second pull-up is connected to the first bitline.

3. The circuit of claim 1, wherein the write wordline voltage is asserted by utilizing one or more intermediate voltage steps between the read wordline voltage and the write wordline voltage.

4. The circuit of claim 1, wherein the write wordline voltage is asserted by ramping the voltage from the read wordline voltage to the write wordline voltage.

5. The circuit of claim 1, wherein the write wordline voltage is greater than the read wordline voltage.

6. The method of claim 1, further comprising delaying for a period of time after accessing the wordline, until a differential voltage is established on associated bitline pairs of the array along the accessed wordline.

7. A method of operating a word line voltage of an SRAM cell, the method comprising:
  accessing a selected wordline associated with the SRAM cell by asserting a read wordline voltage to the selected wordline during a write oreration;
  controlling an increase and a timing of the increase of the word line voltage applied to a word line of an accessed SRAM cell, to allow the accessed cell time to establish a voltage on an associated bit line prior to the word line reaching a full word line voltage, wherein the voltage that is established on the bit line increases the stability of the cell as the word line voltage approaches the full word line voltage; and
  asserting a write wordline voltage after generation of the bit line difference voltage to the selected wordline of the memory cell during the write oreration.

8. The method of claim 7, wherein the controlling of the word line voltage comprises increasing from a non-accessed state of the word line to a first voltage level, then after a time delay, increasing to a second voltage level, wherein the second voltage level is greater than the first voltage level of the word line.

9. The method of claim 7, wherein the controlling of the word line voltage increase and timing comprises increasing from a non-accessed state of the word line to a first voltage level, then increasing to a second voltage level, wherein the second voltage level is greater than the first voltage level of the word line.

10. The method of claim 8, wherein the word line voltage increase between the first voltage level and the second voltage level comprises one or more intermediate voltage steps.

11. The method of claim 8, wherein the word line voltage increase between the first voltage level and the second voltage level comprises ramping the voltage from the first voltage level to the second voltage level.

12. The method of claim 10, wherein the word line voltage increase to one or more of the first and second voltage levels comprises a ramped increase.

13. The method of claim 7, wherein the SRAM cell comprises a differential SRAM cell, and wherein the word line voltage on the wordline is controlled such that the cell establishes a differential voltage on an associated pair of bit lines.

14. The method of claim 13, further comprising an SRAM bitline enhancement circuit for enhancing the differential voltage established on the bit line pair.

15. The method of claim 14, wherein the SRAM bitline enhancement circuit comprises a sense amplifier used at each bitline pair.

16. The method of claim 14, wherein the SRAM bitline enhancement circuit comprises a half-latch.

17. The method of claim 1, further comprising:
  imposing a delay period after asserting a read wordline voltage to the selected wordline during a write operation;
  wherein the delay period allows unaddressed cells on the row of cells to establish a predetermined differential voltage on bit lines associated with the selected wordline.

18. The method of claim 1, wherein the predetermined differential voltage is imposed on the bit lines associated with unaddressed cells by the unaddressed cells respectively.

19. An integrated circuit comprising:

an array of SRAM memory cells arranged in rows and columns, the SRAM cell comprising cross-coupled amplifiers having internal pull-up transistors connected to a supply line;

a plurality of wordlines associated with the rows of cells of the array;

a plurality of bit lines associated with the columns of cells of the array;

an SRAM bitline enhancement circuit for enhancing a bit line difference voltage established on a bit line pair;

a word line driver operable to drive a selected word line of the array, wherein the wordline driver is further operable to:

during a write operation, access the selected wordline associated with the SRAM memory cell by asserting a read wordline voltage to the selected wordline;

impose a delay period after asserting a read wordline voltage to the selected wordline during a write operation;

generate a bit line difference voltage on the bit lines; and assert a write wordline voltage after generation of the bit line difference voltage to the selected wordline of the memory cell during the write operation.

20. The integrated circuit of claim 19, wherein the delay period allows unaddressed cells on the row of cells to establish a predetermined differential voltage on bit lines associated with the selected wordline.

* * * * *